(12) United States Patent
Hara

(10) Patent No.: US 6,198,319 B1
(45) Date of Patent: Mar. 6, 2001

(54) POWER-ON CIRCUIT BUILT IN IC

(75) Inventor: Hiroshi Hara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/449,742

(22) Filed: Nov. 26, 1999

(30) Foreign Application Priority Data

Nov. 30, 1998 (JP) .................................................. 10-340053

(51) Int. Cl.[7] ...................................................... H03L 7/00
(52) U.S. Cl. .......................................... 327/143; 327/198
(58) Field of Search .................................. 327/141, 142, 327/143, 198

(56) References Cited

U.S. PATENT DOCUMENTS 5,801,561 * 9/1998 Wong et al. .......................... 327/143

* cited by examiner

Primary Examiner—Toan Tran
Assistant Examiner—Linh Nguyen
(74) Attorney, Agent, or Firm—McGuireWoods LLP

(57) ABSTRACT

The invention provides a power-on circuit which assures a high impedance state of a terminal of an IC until the IC starts its operation after a point of time immediately after a power supply voltage is made available to the IC. The power-on circuit is built in a synchronous IC memory and includes a ring counter, an output controlling circuit, and a pulse signal interruption circuit. The ring counter successively generates a pulse signal after a power supply voltage begins to be supplied to the synchronous IC memory. The output controlling circuit controls an output terminal of the synchronous IC memory to a high impedance state while the pulse signal generated by the ring counter is inputted to the output controlling circuit. The pulse signal interruption circuit interrupts the pulse signal from being inputted to the output controlling circuit after a clock signal is inputted to the pulse signal interruption circuit.

7 Claims, 4 Drawing Sheets

POWER-ON CIRCUIT BUILT IN IC

BACKGROUND OF THE INVENTION

1. Field of the Invention

The present invention relates to a power-on circuit which is built in an IC (integrated circuit) device such as a synchronous IC memory.

2. Description of the Related Art

Conventionally, a power-on circuit is built in various IC devices, and a power-on circuit built in a synchronous IC memory is shown in FIG. 3.

Referring to FIG. 3, the conventional power-on circuit shown includes a one-shot pulse generation circuit 50 for generating a single pulse signal P, and an output controlling circuit 52 for controlling an output terminal DQ to a high impedance state in response to the pulse signal P generated by the one-shot pulse generation circuit 50. The power-on circuit further includes a mode discrimination circuit 54.

The one-shot pulse generation circuit 50 includes a pair of p-channel FETs (field effect transistors) 501 and 502 and a resistor 503 connected in series, and an invertor 504 having an input terminal connected to a junction B between the FET 502 and the resistor 503. A power supply voltage Vdd is applied to the drain of the FET 502, and the source and the gate of the FET 501 are connected together. The FET 502 is connected at the drain thereof to the source of the FET 501 and at the source thereof to the junction B, and is grounded at the gate thereof. The pulse signal P is outputted from an output terminal of the invertor 504.

The output controlling circuit 52 includes five invertor 521, 523a, 523b, 524a and 524b, a pair of NAND gates 522a and 522b, and a pair of FETs 525a and 525b.

FIG. 4 is a waveform diagram illustrating operation of the one-shot pulse generation circuit 50. In the following, operation of the conventional power-on circuit is described with reference to FIGS. 3 and 4.

In FIG. 4, the power supply voltage Vdd is indicated by a solid line; the voltage $V_B$ at the junction B is indicated by an alternate long and short dash line; and the pulse signal P is indicated by a broken line. When a power supply switch not shown for the synchronous IC memory is turned on, microscopically the power supply voltage Vdd rises gradually. As the power supply voltage Vdd rises, also the voltage $V_B$ at the junction B rises gradually. The invertor 504 outputs a high level signal (H) when the voltage $V_B$ is equal to or lower than a threshold value Vth, but outputs a low level signal (L) when the voltage $V_B$ is higher than the threshold value Vth. Since microscopically also the output signal of the invertor 504 rises and falls gradually, the pulse signal P exhibits a triangular waveform.

If the pulse signal P changes to 'H' in level, then the output level of the output terminal of the invertor 521 changes to 'L'. Consequently, since the 'L' level is inputted to one of a pair of input terminals of each of the NAND gates 522a and 522b, the output terminals of the NAND gates 522a and 522 output the 'H' level irrespective of whether the inputs to the other input terminals of them have the 'H' level or the 'L' level.

Accordingly, since the output terminals Qa and Qb of the mode discrimination circuit 54 have the 'H' level, the FETs 525a and 525b are both controlled to an off state. Consequently, the output terminal DQ exhibits a high impedance state.

Then, if the pulse signal P falls to the 'L' level, then the input signal level to one of the input terminals of the NAND gates 522a and 522b changes to the 'H' level. However, since the 'L' level remains inputted to the other input terminals of the NAND gates 522a and 522b, the output terminals of the NAND gates 522a and 522b continue to output the 'H' level. Accordingly, the high impedance state of the output terminal DQ is maintained.

Even after the power supply switch is turned on as described above, the mode discrimination circuit 54 does not operate until a clock signal CLK is inputted thereto. Consequently, it is unknown, that is, indefinite, whether the output terminals Qa and Qb exhibit the 'H' level or the 'L' level until the clock signal CLK is inputted to the mode discrimination circuit 54 after the power switch is turned on. Therefore, the power-on circuit keeps the output terminal DQ in a high impedance state until the clock signal CLK is inputted after the power supply switch is turned on.

If the clock signal CLK is outputted, then the mode discrimination circuit 54 operates in accordance with a command signal CMD inputted thereto from the body of the synchronous IC memory in which the power-on circuit is incorporated. In particular, the mode discrimination circuit 54 controls the output terminals Qa and Qb thereof to the 'H' level thereby to control the output terminal DQ to a high impedance state. Or, the mode discrimination circuit 54 controls the output terminal Qa to the 'H' level and controls the output terminal Qb to the 'L' level thereby to control the output terminal DQ to the 'L' level. Or on the contrary, the mode discrimination circuit 54 controls the output terminal Qa to the 'L' level and controls the output terminal Qb to the 'H' level thereby to control the output terminal DQ to the 'H' level.

In this instance, since the output terminal of the invertor 521 normally exhibits the 'H' level, one of the two input terminals of each of the NAND gates 522a and 522b always has the 'H' level. Consequently, the output of each of the NAND gates 522a and 522b exhibits the 'L' level if the input level to the other input terminal is 'H', but exhibits the 'H' level if the input level to the other input terminal is 'L'. Consequently, the output controlling circuit 52 does not have an influence on the states of the output terminals Qa and Qb of the output controlling circuit 52.

However, the conventional power-on circuit may possibly operate normally depending upon a rising condition of the power supply voltage. In particular, since the one-shot pulse generation circuit generates only one pulse signal making use of a rising edge of the power supply voltage, if the rising edge of the power supply voltage is steep or conversely much time is required for such rising of the power supply voltage, then the rising edge of the power supply voltage may not possibly be detected.

If the rising edge of the power supply voltage is not detected, then since the one-shot pulse generation circuit cannot generate a pulse signal normally, the high impedance state which is an initial state of the output of the IC cannot be assured. Therefore, when a controller which connects to the same bus as the IC effects a data reading operation before the IC starts its operation after a point of time immediately after the power supply voltage is made available, the read data and output data of the IC may possibly be outputted to the bus at the same time, thereby causing a trouble called bus fight.

SUMMARY OF THE INVENTION

It is an object of the present invention to provide a power-on circuit which assures a high impedance state of a terminal of an IC until the IC starts its operation after a point of time immediately after a power supply voltage is made available to the IC.

In order to attain the object described above, according to the present invention, there is provided a power-on circuit built in an integrated circuit, comprising a successive pulse generation circuit for successively generating a pulse signal after a power supply voltage begins to be supplied to the integrated circuit, an output controlling circuit for controlling a terminal of the integrated circuit to a high impedance state while the pulse signal generated by the successive pulse generation circuit is inputted thereto, and a pulse signal interruption circuit for interrupting the pulse signal from being inputted to the output controlling circuit after a clock signal is inputted thereto.

When the power supply voltage begins to be supplied to the integrated circuit, the successive pulse generation circuits begins to successively generate a pulse signal. If the pulse signal is outputted normally, then the output controlling circuit controls the terminal of the integrated circuit to a high impedance state. In this instance, even if initially the pulse signal is not outputted normally depending upon a rising condition of the power supply voltage or the like, since the pulse signal is successively outputted, the output controlling circuit controls the terminal of the integrated circuit to a high impedance state sooner or later. Then, when the clock signal begins to be outputted from the integrated circuit, the pulse signal interruption circuit interrupts the pulse signal from being inputted to the output controlling circuit. Consequently, the high impedance state of the terminal of the integrated circuit is cancelled.

With the power-on circuit, since the successive pulse generation circuit successively generates a pulse signal for a time until the integrated circuit starts its operation after a point of time immediately after the power supply voltage begins to be supplied to the integrated circuit, even if the output controlling circuit initially fails to latch the pulse signal, it can latch the pulse signal produced later, and consequently, the output controlling circuit can control the terminal of the integrated circuit with certainty to a high impedance state. Besides, when the integrated circuit starts its operation, the pulse signal interruption circuit latches the clock signal and interrupts supply of the pulse signal to the output controlling circuit, and consequently, the terminal of the integrated circuit is not kept in a high impedance state. Consequently, since the terminal of the integrated circuit can be maintained in a high impedance state with certainty for a time until the integrated circuit starts its operation after the power supply voltage to the integrated circuit is made available, occurrence of a trouble called bus fight with another integrated circuit can be prevented.

The successive pulse generation circuit may be a ring counter. Where the power-on circuit includes a ring counter serving as the successive pulse generation circuit and a latch circuit serving as the pulse signal interruption circuit in place of a one short pulse generation circuit as is employed in the conventional power-on circuit described hereinabove with reference to FIG. 3, it is simple in construction and can be implemented by applying a little modification to a conventional synchronous IC memory.

Alternatively, the successive pulse generation circuit may be an oscillator which is built in the integrated circuit. Where the oscillator is used as the successive pulse generation circuit, the power-on circuit can be implemented by applying a less modification to a conventional synchronous IC memory.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Figure 1:
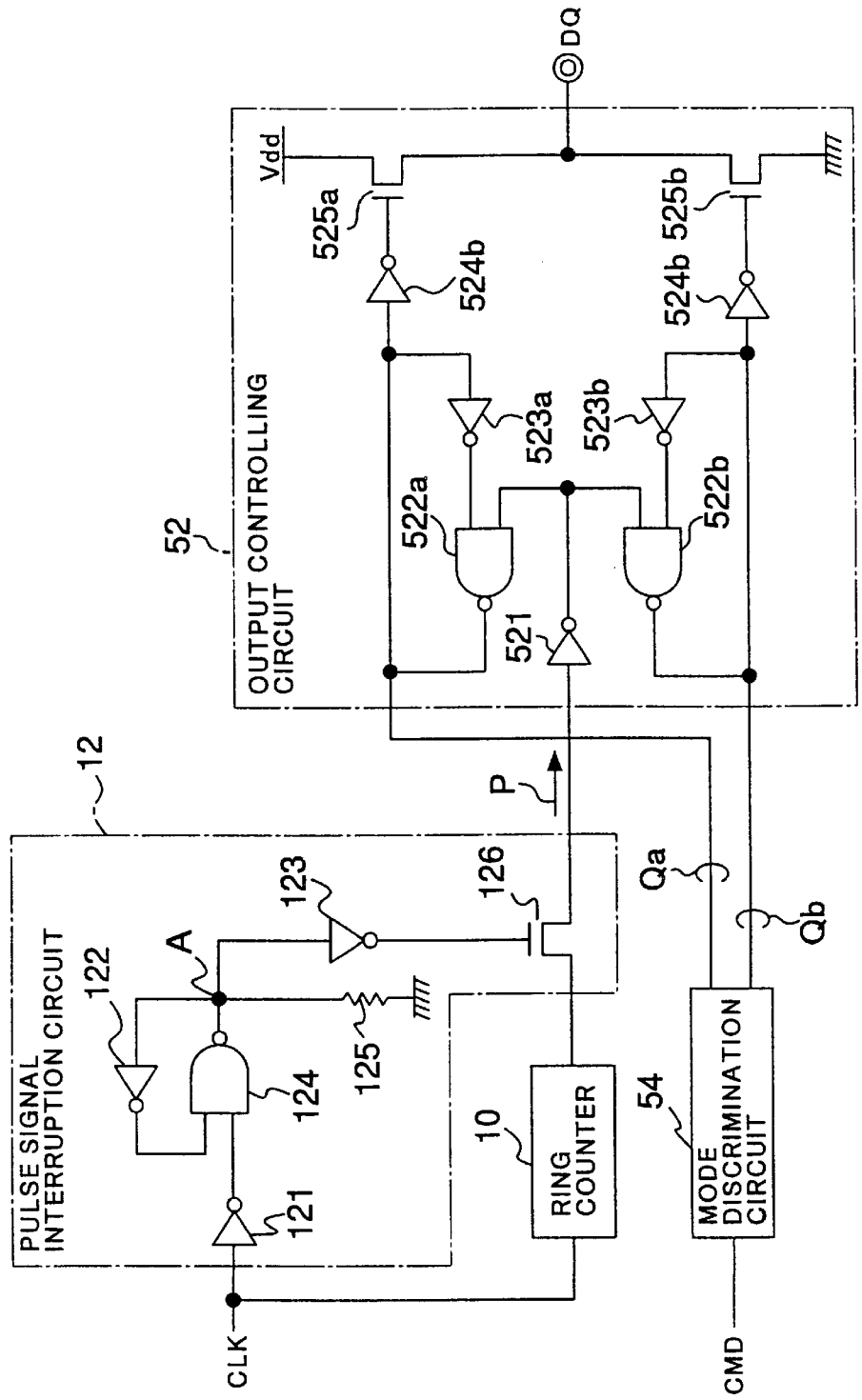
FIG. 1 is a circuit diagram of a power-on circuit to which the present invention is applied.

Referring to FIG. 1, there is shown a power-on circuit to which the present invention is applied. The power-on circuit is incorporated in a synchronous IC memory (not shown) and includes a ring counter 10, an output controlling circuit 52, and a pulse signal interruption circuit 12. The ring counter 10 successively outputs a pulse signal P after a power supply voltage Vdd begins to be supplied to the synchronous IC memory. The output controlling circuit 52 controls an output terminal DQ of the synchronous IC memory to a high impedance state while the pulse signal P generated by the ring counter 10 is inputted to the output controlling circuit 52. The pulse signal interruption circuit 12 interrupts the pulse signal P from being inputted to the output controlling circuit 52 when a clock signal CLK is inputted thereto.

The power-on circuit further includes a mode discrimination circuit 54.

The pulse signal interruption circuit 12 includes invertor 121, 122 and 123, a NAND gate 124, a resistor 125 and a field effect transistor (FET) 126. The clock signal CLK is inputted to the invertor 121, and the NAND gate 124 is connected at one of a pair of input terminals thereof to an output terminal of the invertor 121. The invertor 122 is connected at an input terminal thereof to an output terminal of the NAND gate 124, and is connected at an output terminal thereof to the other input terminal of the NAND gate 124. The resistor 125 is connected at a terminal thereof to a junction A between the input terminal of the invertor 122 and the output terminal of the NAND gate 124, and is grounded at the other terminal thereof. The FET 126 is connected at the gate thereof to the junction A and at the drain thereof to an output terminal of the ring counter 10 from which the pulse signal P is outputted. The FET 126 is further connected at the source thereof to the input terminal of the output controlling circuit 52 to which the pulse signal P is inputted.

The output controlling circuit 52 includes five invertors 521, 523a, 523b, 524a and 524b, a pair of NAND gates 522a and 522b, and a pair of n-channel FETs 525a and 525b. The pulse signal P is inputted to the invertor 521, and the NAND gate 522a is connected at one of a pair of input terminals thereof to an output terminal of the invertor 521 and at an output terminal thereof to an output terminal Qa of the mode discrimination circuit 54. The invertor 523a is connected at an input terminal thereof to the output terminal Qa of the mode discrimination circuit 54 and at an output terminal thereof to the other input terminal of the NAND gate 522a. The invertor 524a is connected at an input terminal thereof to the output terminal Qa of the mode discrimination circuit 54. The FET 525a is connected at the gate thereof to an output terminal of the invertor 524a and at the source thereof to the output terminal DQ, and the power supply voltage Vdd is applied to the drain of the FET 525a.

The NAND gate 522b is connected at one of a pair of input terminals thereof to the output terminal of the invertor 521 and at an output terminal thereof to the other output terminal Qb of the mode discrimination circuit 54. The invertor 523b is connected at an input terminal thereof to the output terminal Qb of the mode discrimination circuit 54 and at an output terminal thereof to the other input terminal of the NAND gate 522b. The invertor 524b is connected at an input terminal thereof to the output terminal Qb of the mode discrimination circuit 54. The FET 525b is connected at the gate thereof to an output terminal of the invertor 524b and at the drain thereof to the output terminal DQ and is grounded at the source thereof.

Operation of the power-on circuit of the present embodiment is described.

Even if a power supply switch not shown for the synchronous IC memory is first turned on, the clock signal CLK is not outputted immediately. In this instance, since the input terminal of the invertor 121 of the pulse signal interruption circuit 12 and the junction A both exhibit the 'L' level, the output terminals of the invertors 121 and 122 both output the 'H' level. Consequently, since the inputs to both of the input terminals of the NAND gate 124 have the 'H' level, the output terminal of the NAND gate 124 exhibits the 'L' level. Consequently, the output terminal of the invertor 123 exhibits the 'H' level, and the FET 126 exhibits an on state.

Meanwhile, after the power supply switch is turned on, the ring counter 10 successively generates a pulse signal P. In this instance, since the FET 126 of the pulse signal interruption circuit 12 is in an on state as described above, the pulse signal P is transmitted from the ring counter 10 to the output controlling circuit 52. When the pulse signal P changes to the 'H' level, the output terminal of the invertor 521 of the output controlling circuit 52 changes to the 'L' level. Consequently, since the input signal to one of the input terminals of each of the NAND gates 522a and 522b exhibits the 'L' level, the output terminals of the NAND gates 522a and 522b both exhibit the 'H' level irrespective of whether the input signals to the other input terminals of the NAND gates 522a and 522b have the 'H' level or the 'L' level. Accordingly, the output terminals Qa and Qb of the mode discrimination circuit 54 both exhibit the 'H' level, and consequently, both of the FETs 525a and 525b exhibit an off state. Consequently, the output terminal DQ exhibits a high impedance state.

Thereafter, when the pulse signal P changes to the 'L' level, the input signal to one of the input signals of each of the NAND gates 522a and 522b changes to the 'H' level. However, since the inputs to the other input terminals of the NAND gates 522a and 522b have the 'L' level, the output terminals of the NAND gates 522a and 522b continue to output the 'H' level. Consequently, the high impedance state of the output terminal DQ is maintained.

In this instance, even if initially the pulse signal P is not outputted normally depending upon a rising condition of the power supply voltage Vdd, since the pulse signal P is successively outputted from the ring counter 10, the output terminal DQ is controlled to a high impedance state soon by the output controlling circuit 52.

Thereafter, when a clock signal CLK is outputted from the synchronous IC memory, that is, when the clock signal CLK changes to the 'H' level, the output terminal of the invertor 121 of the pulse signal interruption circuit 12 changes to the 'L' level. Consequently, since the input to one of the input terminals of the NAND gate 124 exhibits the 'L' level, the output terminal of the NAND gate 124 outputs the 'H' level irrespective of whether the input to the other input terminal of the NAND gate 124 is the 'H' level or the 'L' level. When the output terminal of the NAND gate 124, that is, the junction A, changes to the 'H' level, the output terminal of the invertor 123 changes to the 'L' level, and consequently, the FET 126 is turned off. Consequently, the pulse signal P is interrupted from being inputted to the output controlling circuit 52.

Then, when the clock signal CLK changes back to the 'L' level, the output terminal of the invertor 121 of the pulse signal interruption circuit 12 changes to the 'H' level. However, the output terminal of the NAND gate 124 continues to output the 'H' level since the input to the other input terminal of the NAND gate 124 is the 'L' level. Accordingly, the FET 126 remains in an off state. Accordingly, after operation of the synchronous IC memory is started, the high impedance state of the output terminal DQ can be cancelled.

Figure 2:
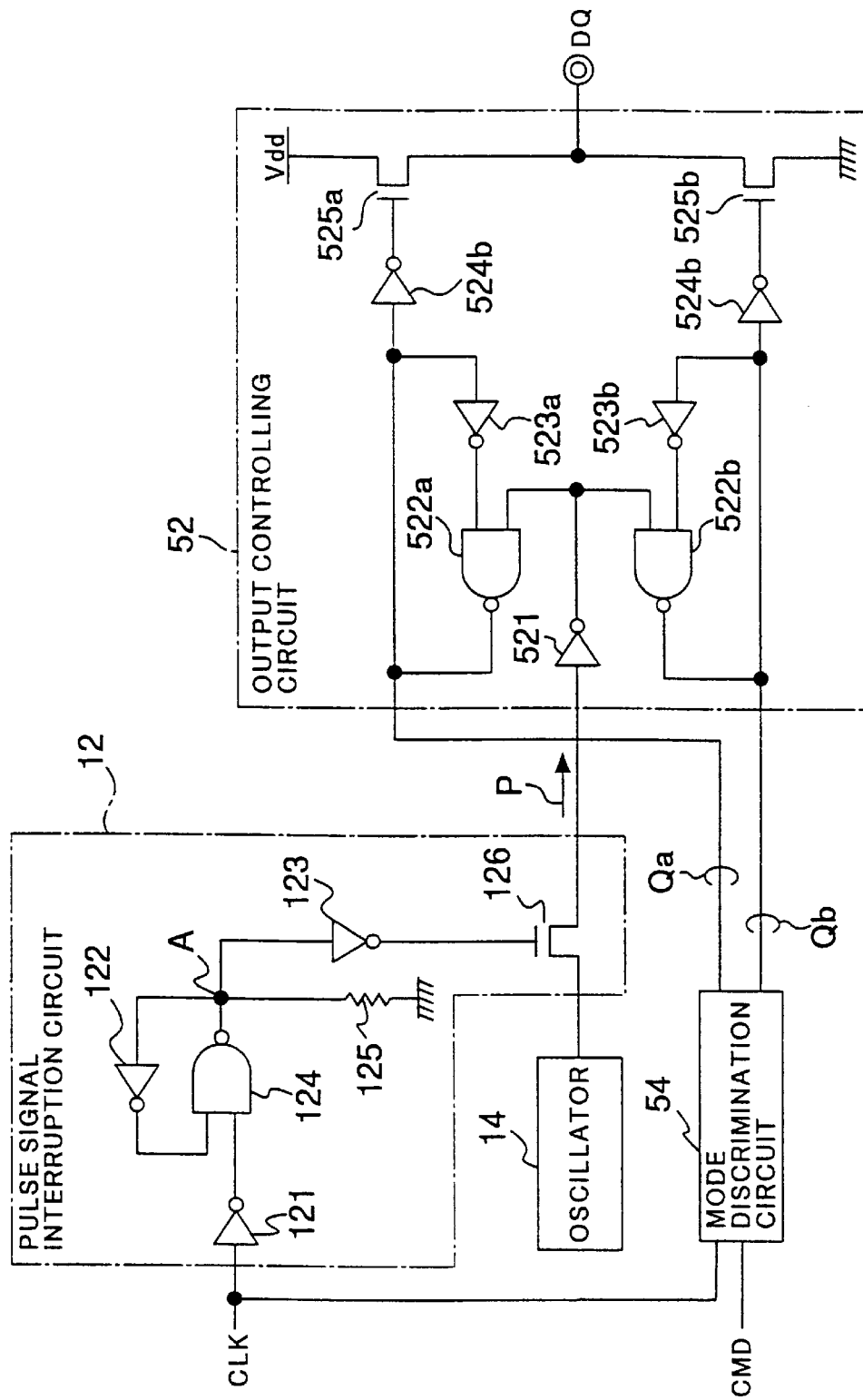
FIG. 2 is a circuit diagram of a modification to the power-on circuit shown in FIG. 1.
Figure 3:
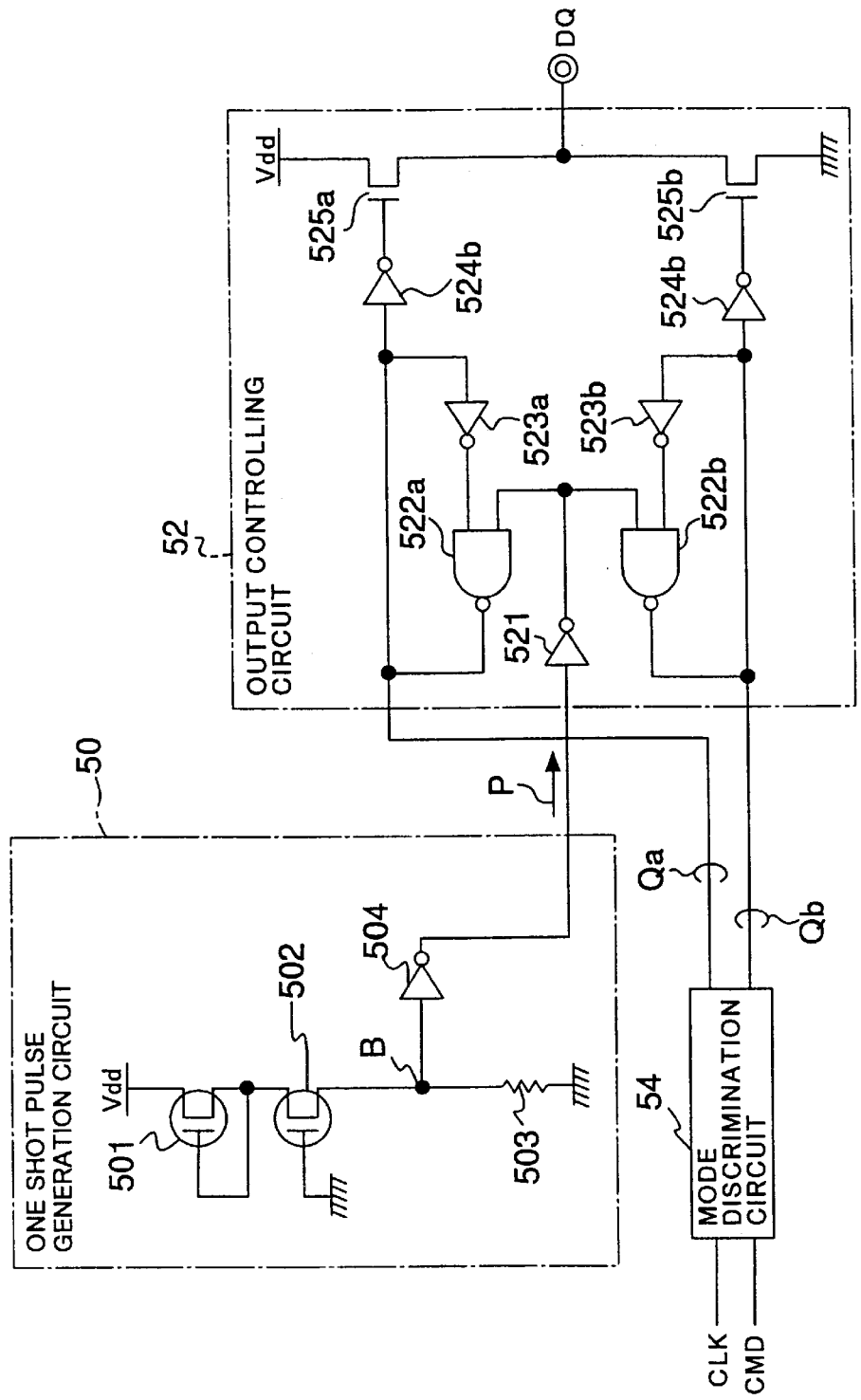
FIG. 3 is a circuit diagram showing a conventional power-on circuit.
Figure 4:
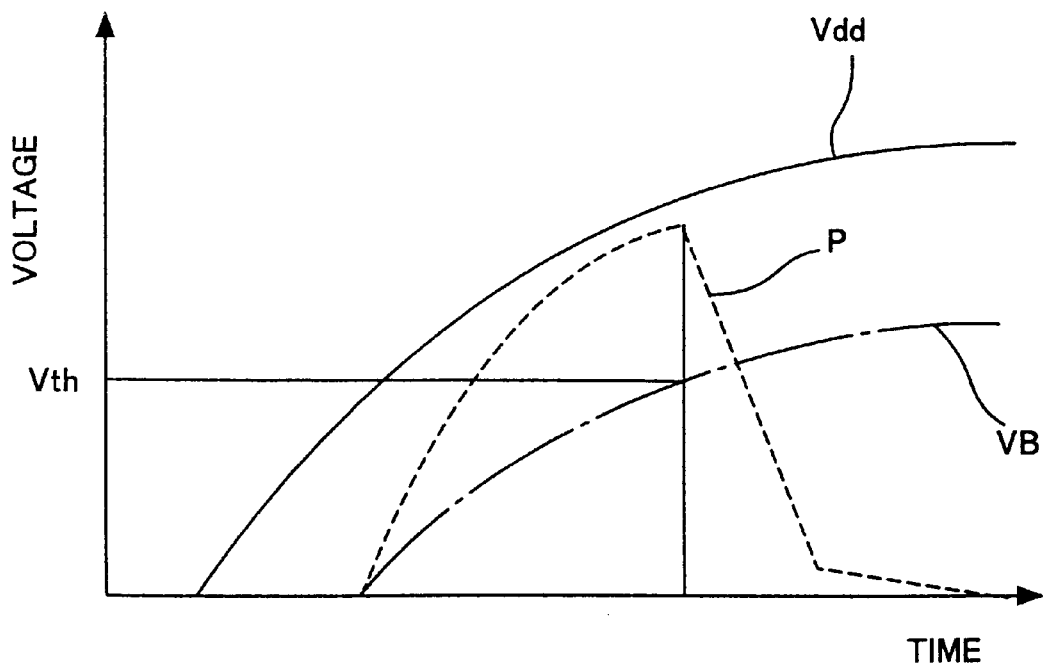
FIG. 4 is a waveform diagram illustrating operation of a one-shot pulse generation circuit of the power-on circuit shown in FIG. 3.

FIG. 2 shows a modification to the power-on circuit described hereinabove with reference to FIG. 1. Referring to FIG. 2, the modified power-on circuit shown is different from the power-on circuit of FIG. 1 in that it includes an oscillator 14 in place of the ring counter 10 and the clock signal CLK is inputted to the mode discrimination circuit 54. Generally, a synchronous IC memory includes a built-in oscillator which starts its operation when a power supply voltage begins to be supplied to the synchronous IC memory. Thus, such a built-in oscillator of the synchronous IC memory in which the modified power-on circuit is incorporated may be used as the oscillator 14. Where the oscillator 14 of the synchronous IC memory is utilized, the modified power-on circuit can be implemented with a little modification to the conventional power-on circuit of FIG. 3.

While a preferred embodiment of the present invention has been described using specific terms, such description is for illustrative purposes only, and it is to be understood that changes and variations may be made without departing from the spirit or scope of the following claims.

What is claimed is:

1. A power-on circuit built in an integrated circuit, comprising:
    a successive pulse generation circuit for successively generating a pulse signal after a power supply voltage begins to be supplied to said integrated circuit;
    an output controlling circuit for controlling a terminal of said integrated circuit to a high impedance state while the pulse signal generated by said successive pulse generation circuit is inputted thereto; and
    a pulse signal interruption circuit for interrupting the pulse signal from being inputted to said output controlling circuit after a clock signal is inputted thereto.

2. A power-on circuit as claimed in claim 1, wherein said successive pulse generation circuit is a ring counter.

3. A power-on circuit as claimed in claim 1, wherein said successive pulse generation circuit is an oscillator which is built in said integrated circuit.

4. A power-on circuit as claimed in claim 1, wherein said integrated circuit is a synchronous integrated circuit memory.

5. A power-on circuit as claimed in claim 1, wherein said pulse signal interruption circuit includes a first invertor for receiving the clock signal, a NAND gate having a pair of input terminals to one of which an output terminal of said first invertor is connected, a second invertor having an input terminal connected to an output terminal of said NAND circuit and an output terminal connected to the other input terminal of said NAND gate, a resistor having a terminal connected to a junction between the input terminal of said second invertor and the output terminal of said NAND circuit and another terminal grounded, and a field effect transistor having a gate connected to the junction, a drain connected to an output terminal of said successive pulse generation circuit from which the pulse signal is outputted, and a source connected to an input terminal of said pulse signal interruption circuit to which the pulse signal is inputted.

6. A power-on circuit as claimed in claim 1, wherein the terminal of said integrated circuit is an input terminal or an output terminal.

7. A power-on circuit as claimed in claim 1, wherein the terminal of said integrated circuit is an input/output terminal.

* * * * *